US012635213B2

(12) United States Patent
Tzou et al.

(10) Patent No.:  US 12,635,213 B2
(45) Date of Patent:      May 19, 2026

(54) SEMICONDUCTOR STRUCTURE AND SEMICONDUCTOR DEVICE

(71) Applicant: Vanguard International Semiconductor Corporation, Hsinchu (TW)

(72) Inventors: Chen-Dong Tzou, Taipei City (TW); Chia-Hao Lee, Zhubei City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 373 days.

(21) Appl. No.: 18/350,242

(22) Filed: Jul. 11, 2023

(65) Prior Publication Data

US 2025/0022923 A1      Jan. 16, 2025

(51) Int. Cl.
H10D 64/00          (2025.01)
H10D 8/60           (2025.01)

(52) U.S. Cl.
CPC ............. H10D 64/112 (2025.01); H10D 8/60 (2025.01)

(58) Field of Classification Search
CPC ...... H10D 64/112; H10D 8/60; H10D 30/668; H10D 64/117; H10D 62/8325; H10D 62/107; H10D 84/146; H10D 8/605
See application file for complete search history.

(56) References Cited

U.S. PATENT DOCUMENTS

2009/0008709 A1      1/2009  Yedinak et al.
2010/0140697 A1*     6/2010  Yedinak ............... H10D 30/668
                                                        257/334

2012/0032258 A1*  2/2012  Zeng .................... H10D 30/668
                                                        257/330
2012/0187498 A1   7/2012  Qu et al.
2014/0042525 A1   2/2014  Darwish et al.
2014/0042535 A1*  2/2014  Darwish ............ H10D 30/0297
                                                        257/334
2014/0252463 A1*  9/2014  Darwish ............ H10D 30/0297
                                                        257/330
2018/0366569 A1*  12/2018  Zeng .................... H10D 30/473
2021/0028305 A1*  1/2021  Hsieh ................. H10D 30/0297

(Continued)

OTHER PUBLICATIONS

Taiwanese Office Action and Search Report for Taiwanese Application No. 112115310, dated Dec. 4, 2023.

*Primary Examiner* — Steven B Gauthier
*Assistant Examiner* — Khatib A Rahman
(74) *Attorney, Agent, or Firm* — Birch, Stewart, Kolasch & Birch, LLP

(57)                    ABSTRACT

A semiconductor structure is provided. The semiconductor structure includes a substrate, an epitaxial layer, multiple field plate structures, multiple shielding layers, an upper electrode layer, and a lower electrode layer. The epitaxial layer is disposed on the substrate. The field plate structures include a first field plate structure and a second field plate structure respectively disposed in a first unit and a second unit of the semiconductor structure. The shielding layers are disposed between the bottom portions of the field plate structures and the epitaxial layer. The upper electrode layer covers the field plate structures. The upper electrode layer is separated from the epitaxial layer in the first unit and is in direct contact with the epitaxial layer in the second unit. The lower electrode layer is disposed under the substrate and opposite to the epitaxial layer.

18 Claims, 9 Drawing Sheets

(56) References Cited

U.S. PATENT DOCUMENTS

| | | | |
|---|---|---|---|
| 2021/0119030 A1* | 4/2021 | Hsieh | H10D 64/256 |
| 2021/0126124 A1* | 4/2021 | Hsieh | H10D 30/665 |
| 2023/0100800 A1* | 3/2023 | Yilmaz | H10D 30/0295 |
| | | | 257/288 |

* cited by examiner

SEMICONDUCTOR STRUCTURE AND SEMICONDUCTOR DEVICE

BACKGROUND

Technical Field

The present disclosure relates to a semiconductor structure, and in particular it relates to a semiconductor including field plate structures.

Description of the Related Art

In recent years, the semiconductor industry has made significant progress in the development of power devices. For example, high voltage metal-oxide-semiconductor (HV-MOS) transistors, insulated gate bipolar transistors (IGBTs), junction field effect transistors (JFET), Schottky barrier diodes (SBDs) and other power devices have been developed. These devices are commonly used in various applications such as power amplification and power control in power systems of appliances such as household appliances, communication equipment, and automotive generators.

In existing designs of metal-oxide-semiconductor transistors, the on-resistance of the transistors can be reduced by using a trench transistor structure. In addition, by forming a transistor that includes a split-gate, the parasitic capacitance of the semiconductor device can be reduced to minimize switching loss. Furthermore, a chip with a fast recovery diode (FRD) or a Schottky barrier diode may be connected in parallel to a chip with a transistor. In this way, the charge of reverse recovery can be reduced to minimize switching loss even further.

However, in order to package the above two chips together, it is necessary to use bonding wires for electrical connection, which will generate additional parasitic inductance and unnecessary signals. In addition, due to the need to package diodes and transistors that are located in different chips, such a traditional process is tedious, and the resulting semiconductor structure will take up a lot of space. Therefore, the research and development of power devices requires continuous updates and adjustments to solve various problems faced by power devices during manufacture and operation.

BRIEF SUMMARY

The present disclosure provides a semiconductor structure. The semiconductor structure includes a substrate, an epitaxial layer, multiple field plate structures, multiple shielding layers, an upper electrode layer, and a lower electrode layer. The epitaxial layer is disposed on the substrate. The field plate structures include a first field plate structure and a second field plate structure respectively disposed in a first unit and a second unit of the semiconductor structure. The shielding layers are disposed between the bottom portions of the field plate structures and the epitaxial layer. The upper electrode layer covers the field plate structures. The upper electrode layer is separated from the epitaxial layer in the first unit and is in direct contact with the epitaxial layer in the second unit. The lower electrode layer is disposed under the substrate and opposite to the epitaxial layer.

The present disclosure provides a semiconductor device. The semiconductor device includes the aforementioned semiconductor structure, a transition layer, and a channel blocking layer. The transition layer laterally surrounds the semiconductor structure. The channel blocking layer laterally surrounds the transition layer. The semiconductor structure has a plurality of first units and second units.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
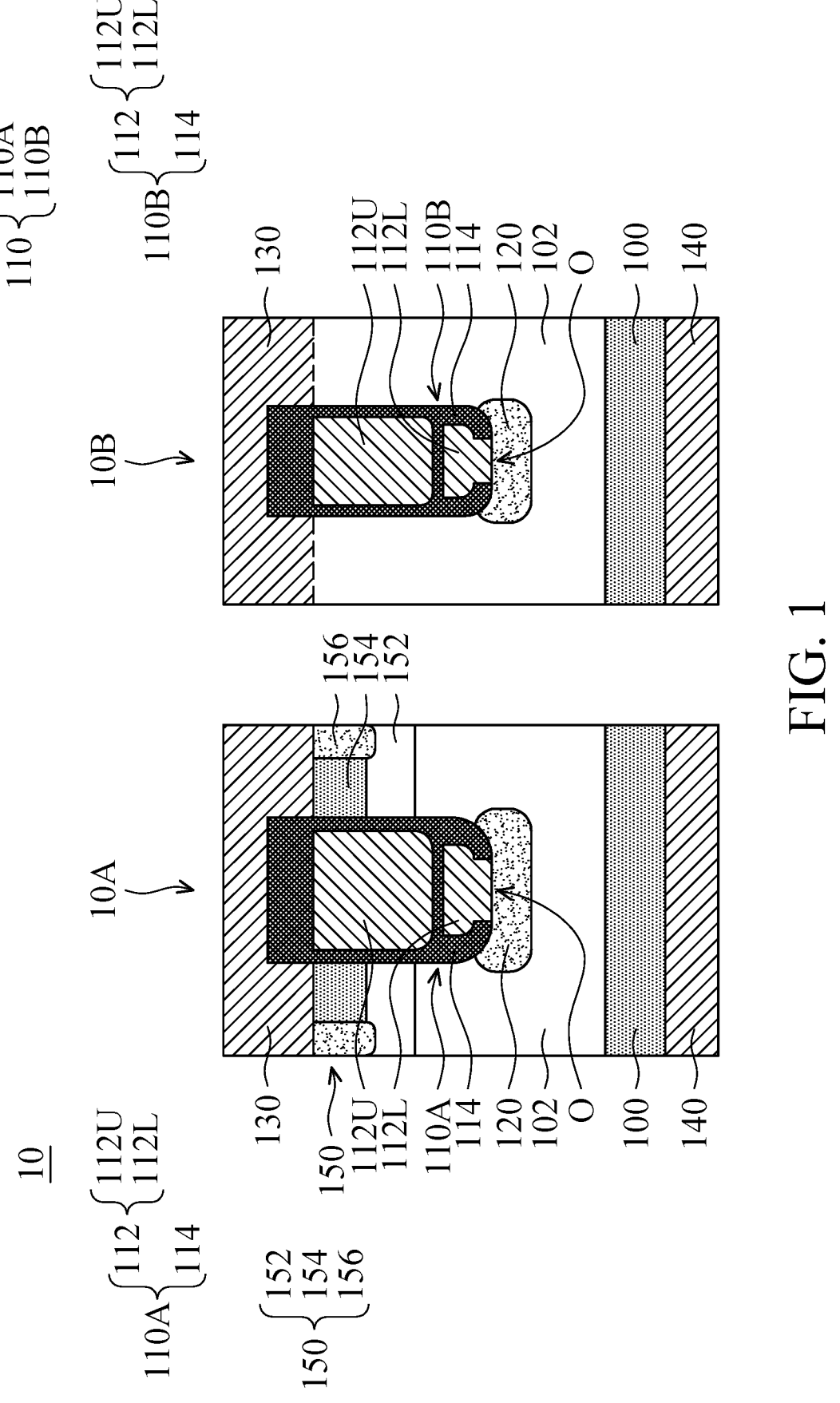
FIG. 1 illustrates a cross-sectional view of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "substantially" used herein generally refer to a given value or a range within 20 percent, preferably within 10 percent, and more preferably within 5 percent, within 3 percent, within 2 percent, within 1 percent, or within 0.5 percent. It should be noted that the amounts provided in the specification are approximate amounts, which means that even "about", "approximate", or "substantially" are not specified, the meanings of "about", "approximate", or "substantially" are still implied.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The present disclosure provides a semiconductor structure and a semiconductor device including the semiconductor structure, and the semiconductor structure may include a first unit and a second unit respectively used as a control element and a diode element. Multiple field plate structures of the present disclosure are disposed in both the first unit and the second unit, and the first unit and the second unit may be formed to have a common substrate and epitaxial layer. Therefore, the manufacturing of the control unit and the diode unit of the present disclosure can be well integrated, thereby reducing the use of masks in the manufacturing process and avoiding additional parasitic inductance between the two units. Furthermore, the second cell used as a single carrier element can reduce the reverse recovery time of the semiconductor structure. The shielding layers disposed between the bottom portions of the field plate structures and the epitaxial layer can reduce the electric field in the oxide of the field plate structures and reduce the parasitic capacitance between the gate and the drain of the semiconductor structure. Furthermore, reducing the surface electric field of the Schottky diode through the disposition of the field plate structures and the shielding layers can reduce the leakage current from the image force barrier lowering effect. Therefore, the semiconductor structure and semiconductor device of the present disclosure can reduce power loss during operation while having better reverse recovery properties.

FIG. 1 illustrates a cross-sectional view of a semiconductor structure 10, in accordance with some embodiments of the present disclosure. The semiconductor structure 10 may include a substrate 100 and an epitaxial layer 102 disposed on the substrate 100. The semiconductor structure 10 may further include multiple field plate structures 110, including a first field plate structure 110A and a second field plate structure 110B disposed in a first unit 10A and a second unit 10B of the semiconductor structure 10, respectively. As shown in FIG. 1, multiple shielding layers 120 may be disposed between the bottom portions of each of the field plate structures 110 and the epitaxial layer 102. The semiconductor structure 10 may further include an upper electrode layer 130 covering the field plate structures 110 and a lower electrode layer 140 disposed under the substrate 100 and opposite to the epitaxial layer 102. As shown in FIG. 1, the upper electrode layer 130 may be separated from the epitaxial layer 102 in the first unit 10A and may be in direct contact with the epitaxial layer 102 in the second unit 10B.

In some embodiments, the substrate 100 is a bulk semiconductor substrate, such as a semiconductor wafer. In some embodiments, the substrate 100 is formed of silicon, germanium, other suitable semiconductor materials, or a combination thereof. For example, in a particular embodiment, the substrate 100 includes silicon. In some embodiments, the substrate 100 may include compound semiconductors, such as silicon carbide, gallium nitride, gallium oxide, gallium arsenide, other suitable semiconductor materials, or a combination thereof. In some embodiments, the substrate 100 may include alloy semiconductors, such as silicon germanium, silicon germanium carbide, other suitable materials, or a combination thereof. In some embodiments, the substrate 100 may be formed of multi-layer materials, such as multi-layer materials including silicon/silicon germanium or silicon/silicon carbide.

In some embodiments of the present disclosure, for example, the substrate 100 is a wafer doped with a dopant of a first conductivity type, and the first conductivity type is n-type. In some other embodiments, the first conductivity type may also be p-type. In the case that the first conductivity type is n-type, the dopant with the first conductivity type may be, for example, nitrogen, phosphorus, arsenic, antimony, bismuth, or silicon. In some embodiments, the doping concentration of the substrate 100 may be between about 1e19 atoms/cm$^3$ and about 1e21 atoms/cm$^3$.

The epitaxial layer 102 may include the same or similar material as the substrate 100, such as silicon, germanium, silicon carbide, gallium nitride, gallium oxide, gallium arsenide, silicon germanium, silicon germanium carbide, other suitable materials, or combination thereof. In some embodiments, the substrate 100 and the epitaxial layer 102 have the same conductivity type (e.g., n-type), and the substrate 100 and the epitaxial layer 102 may include the same dopants. In some embodiments, the doping concentration of the aforementioned dopants in the epitaxial layer 102 is smaller than that in the substrate 100. In some embodiments, the doping concentration of the epitaxial layer 102 may be between about 1e13 atoms/cm$^3$ and about 1e18 atoms/cm$^3$. In some embodiments of the present disclosure, for example, the epitaxial layer 102 includes silicon carbide. By forming the epitaxial layer 102 with silicon carbide, the epitaxial layer 102 can be doped with dopants suitable for the energy band range of silicon carbide and having lower activation energy. In addition, the epitaxial layer 102 formed of silicon carbide can provide higher breakdown voltage, lower leakage current, and lower on-resistance.

In some embodiments, each field plate structure 110 includes a conductive filling layer 112 and a dielectric spacer layer 114. At least a portion of the conductive filling layer 112 may be embedded in the epitaxial layer 102, and the dielectric spacer layer 114 may extend between the conductive filling layer 112 and the epitaxial layer 102. In some embodiments, as shown in FIG. 1, the conductive filling layer 112 may be completely embedded in the epitaxial layer 102 in the second unit 10B, so that the upper surface of the conductive filling layer 112 is lower than or coplanar with the upper surface of the epitaxial layer 102. In some embodiments, the dielectric spacer layer 114 has a top portion extending between the conductive filling layer 112 and the upper electrode layer 130.

The material of the conductive filling layer 112 may include polysilicon, metal, metal nitride, other suitable conductive materials, or a combination thereof. The material of the dielectric spacer layer 114 may include silicon oxide, hafnium oxide, zirconium oxide, aluminum oxide, aluminum oxide hafnium alloy, silicon hafnium oxide, silicon hafnium oxynitride, tantalum hafnium oxide, titanium hafnium oxide, zirconium hafnium oxide, other suitable high-k dielectric materials, or a combination thereof. In some embodiments, the dielectric spacer layer 114 includes an oxide having elements in common with the epitaxial layer 102. For example, in a particular embodiment, the epitaxial layer 102 includes silicon or silicon carbide, and the dielectric spacer layer 114 includes silicon oxide.

In some embodiments, each field plate structure 110 includes a conductive filling layer 112 configured as a split-gate structure. As shown in FIG. 1, the conductive filling layer 112 may include an upper conductive layer 112U and a lower conductive layer 112L separated by the dielectric spacer layer 114. The upper conductive layer 112U in the first unit 10A may be electrically connected to a gate (not shown). In some embodiments, the lower conductive layer 112L is electrically connected to a source (not shown). Depending on the design requirements of the semiconductor structure 10, the upper conductive layer 112U in the second unit 10B may be electrically connected to the gate or the source. If the upper conductive layer 112U in the second unit 10B is electrically connected to the gate, when a forward bias voltage is applied to the upper conductive layer 112U in the second unit 10B, an accumulation layer of carriers can be generated in a portion of the epitaxial layer 102 adjacent to the upper conductive layer 112U, which is beneficial to the generation of forward current. If the upper conductive layer 112U in the second unit 10B is electrically connected to the source, the parasitic capacitance of the dielectric spacer layer 114 generated between the upper conductive layer 112U and the epitaxial layer 102 can be reduced, which is beneficial to reducing the switching loss of the semiconductor structure 10.

It should be understood that although the conductive filling layers 112 of the field plate structures 110 in the first unit 10A and the second unit 10B shown in FIG. 1 are configured as split-gate structures, the present disclosure does not limit that the conductive filling layers 112 in all the units must be split-gate structure. For example, the conductive filling layer 112 in the first unit 10A or the second unit 10B may be configured as a split-gate structure, and the conductive filling layer 112 in the other may be a single block.

The dielectric spacer layer 114 may include an opening O in, for example, the first unit 10A and/or the second unit 10B, and the conductive filling layers 112 may be in direct contact with the shielding layers 120 through the opening O.

However, the dielectric spacer layer 114 may also extend between the conductive filling layer 112 and the shielding layers 120 to separate them. In some embodiments, the area of the lower surface of the lower conductive layer 112L is smaller than the area of the upper surface of the lower conductive layer 112L. In some embodiments, the substrate 100 and the epitaxial layer 102 have a first conductivity type (e.g., n-type), and the shielding layers 120 have a second conductivity type (e.g., p-type), which is the opposite of the first conductivity type. The shielding layers 120 can be used to separate the conductive filling layer 112 from the epitaxial layer 102 to prevent excessive electric field from being generated in the dielectric spacer layer 114. In addition, by disposing the shielding layers 120, the electric field in the oxide (such as the dielectric spacer layer 114) in the field plate structures 110 can be reduced and the parasitic capacitance between the gate and the drain of the semiconductor structure 10 can be reduced. Furthermore, through the disposition of the field plate structures 110 and the shielding layers 120, the surface electric field of the Schottky diode element in the second unit 10B is reduced, which can reduce leakage current from the image force barrier lowering effect.

The material of the shielding layers 120 may include, for example, a semiconductor material formed by implantation, other suitable materials, or a combination thereof. In some embodiments of the present disclosure, for example, the shielding layers 120 have a second conductivity type of p-type, and the shielding layers 120 are doped with dopants such as boron and aluminum. In some embodiments, the doping concentration of the shielding layers 120 may be between about 1e14 atoms/cm$^3$ and about 1e19 atoms/cm$^3$.

In some embodiments, as shown in FIG. 1, the epitaxial layer 102 includes a doped structure 150 laterally surrounding the first field plate structure 110A and at the interface with the upper electrode layer 130 in the first unit 10A. The doped structure 150 may include a doped well 152, a first heavily doped region 154, and a second heavily doped region 156. In some embodiments, a portion of the doped well 152 adjacent to the first field plate structure 110A can be used as a channel region when the semiconductor structure 10 operates. For example, when a forward bias is applied to the conductive filling layer 112, an inversion layer can be formed near the sidewall of the doped well 152 adjacent to the first field plate structure 110A to generate current. The second heavily doped region 156 may be used to electrically connect the doped well 152 to the upper electrode layer 130. The first heavily doped region 154 may be electrically connected to the source.

The first heavily doped region 154 may have the same first conductivity type (for example, n-type) as the epitaxial layer 102, and the doped well 152 and the second heavily doped region 156 may have the same second conductivity type (for example, p-type) as the shielding layers 120. The doping concentration of the doping well 152 may be between about 1e15 atoms/cm$^3$ and about 1e18 atoms/cm$^3$. The doping concentration of the first heavily doped region 154 may be between about 1e18 atoms/cm$^3$ and about 1e21 atoms/cm$^3$. The doping concentration of the second heavily doped region 156 may be between about 1e18 atoms/cm$^3$ and about 1e21 atoms/cm$^3$.

The doped structure 150 may include the same or similar material as the portion of the epitaxial layer 102 below the doped structure 150, such as silicon, germanium, silicon carbide, gallium nitride, gallium oxide, gallium arsenide, silicon germanium, silicon germanium carbide, other suitable materials, or a combination thereof. The doped structure 150 may be formed by performing a doping process in the epitaxial material used to form the epitaxial layer 102 in the portion within the region of the semiconductor structure 10 used to form the first unit 10A. In some embodiments, the upper surface of the doped structure 150 is lower than the upper surface of the first field plate structure 110A. In some embodiments, the upper surface of the doped structure 150 is substantially coplanar with the upper surface of the epitaxial layer 102 in the second cell 10B. According to the configuration of the doped structure 150, in some embodiments, as shown in FIG. 1, the upper surface of the epitaxial layer 102 in the first cell 10A is at the same height as the upper surface in the second cell 10B.

The upper electrode layer 130 and the lower electrode layer 140 may be electrically connected to the source and drain (not shown) of the semiconductor structure 10, respectively. However, depending on the structural design of the semiconductor structure 10, in some embodiments of the present disclosure, the upper electrode layer 130 and the lower electrode layer 140 themselves may also be regarded as the source and drain of the semiconductor structure 10, respectively. In addition, in the second unit 10B, there may be a Schottky contact on the interface between the upper electrode layer 130 and the epitaxial layer 102. In this way, the second unit 10B may operate as a single-carrier element (such as a Schottky diode element), thereby improving the reverse recovery property of the semiconductor structure 10 and reducing the reverse recovery time.

In some embodiments, top portions of the field plate structures 110 protrude into the upper electrode layer 130. As shown in FIG. 1, top portions of the first field plate structure 110A and the second field plate structure 110B may protrude into the upper electrode layer 130. Further as shown in FIG. 1, the top portions of the first field plate structure 110A and the second field plate structure 110B may have upper surfaces higher than the surrounding doped structure 150 and epitaxial layer 102 in the first unit 10A and the second unit 10B, respectively.

The upper electrode layer 130 may be or include, for example, platinum (Pt), titanium (Ti), titanium nitride (TiN), tantalum (Ta), tantalum nitride (TaN), tungsten (W), tungsten nitride (WN), gold (Au), iron (Fe), nickel (Ni), beryllium (Be), chromium (Cr), cobalt (Co), antimony (Sb), iridium (Ir), molybdenum (Mo), osmium (Os), thorium (Th), vanadium (V), some other metal or metal nitride, or a combination thereof.

The lower electrode layer 140 may be or include the same or similar material as the upper electrode layer 130. For example, the lower electrode layer 140 may be or include, for example, platinum (Pt), titanium (Ti), titanium nitride (TiN), tantalum (Ta), tantalum nitride (TaN), tungsten (W), nitride tungsten (WN), gold (Au), iron (Fe), nickel (Ni), beryllium (Be), chromium (Cr), cobalt (Co), antimony (Sb), iridium (Ir), molybdenum (Mo), osmium (Os), thorium (Th), vanadium (V), some other metal or metal nitride, or a combination thereof.

It should be understood that the first unit 10A and the second unit 10B may also be referred to as the control element and the diode element of the semiconductor structure 10, respectively. The substrate 100 and the epitaxial layer 102 may extend continuously between the first unit 10A and the second unit 10B. In some embodiments, the first unit 10A and the second unit 10B are electrically connected in parallel through the upper electrode layer 130 and the lower electrode layer 140. In some embodiments of the present disclosure, the field plate structures 110 are disposed in both the first unit 10A and the second unit 10B, and the first unit 10A and the second unit 10B may have common substrate 100 and epitaxial layer 102. Therefore, the control unit and the diode unit of the semiconductor structure 10 can be well integrated. Compared with the conventional semiconductor structure including the control unit and the diode unit, the use of masks in the manufacturing process can be reduced, and additional parasitic inductance between the two units can be avoided.

The configurations of semiconductor devices 1 and 2 will be described below with reference to FIGS. 2A and 3A, and the layout of the first unit 10A and the second unit 10B in the semiconductor structure 10 will be described with reference to FIGS. 2B and 3B.

Figure 2A:
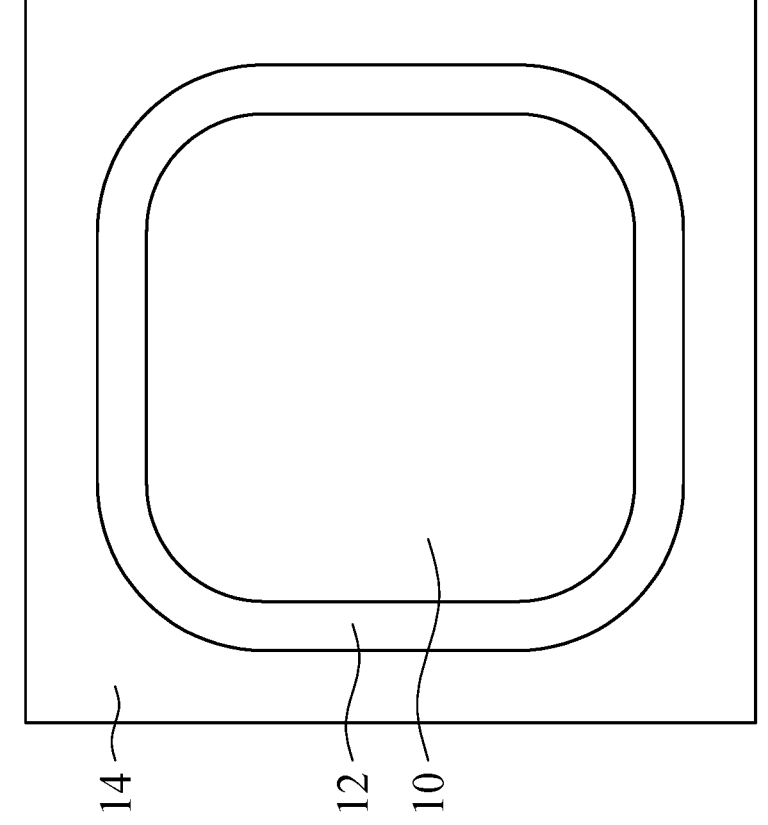
FIG. 2A illustrates a top view of a semiconductor device, in accordance with some embodiments of the present disclosure.

FIG. 2A illustrates a top view of the semiconductor device 1, in accordance with some embodiments of the present disclosure. In addition to the semiconductor structure 10 described above, a transition layer 12 laterally surrounding the semiconductor structure 10 and a channel blocking layer 14 laterally surrounding the transition layer 12 may be disposed. The semiconductor structure 10 may have a plurality of first units and second units, and the first and second units can be respectively used as control units and diode units of the semiconductor device 1. The structures and configurations of the first and second units are similar to those of the first unit 10A and the second unit 10B in FIG. 1, and their detailed descriptions are omitted here for simplicity.

The transition layer 12 may serve to protect internal components of the semiconductor structure 10. The material of the transition layer 12 may include the same or similar material as the epitaxial layer 102, other suitable materials, or a combination thereof. In some embodiments, the transition layer 12 is doped to have the second conductivity type. The channel blocking layer 14 may be used to isolate adjacent wafers. The material of the channel blocking layer 14 may include the same or similar material as that of the epitaxial layer 102, other suitable materials, or a combination thereof. In some embodiments, the channel blocking layer 14 is doped to have the first conductivity type.

Figure 2B:
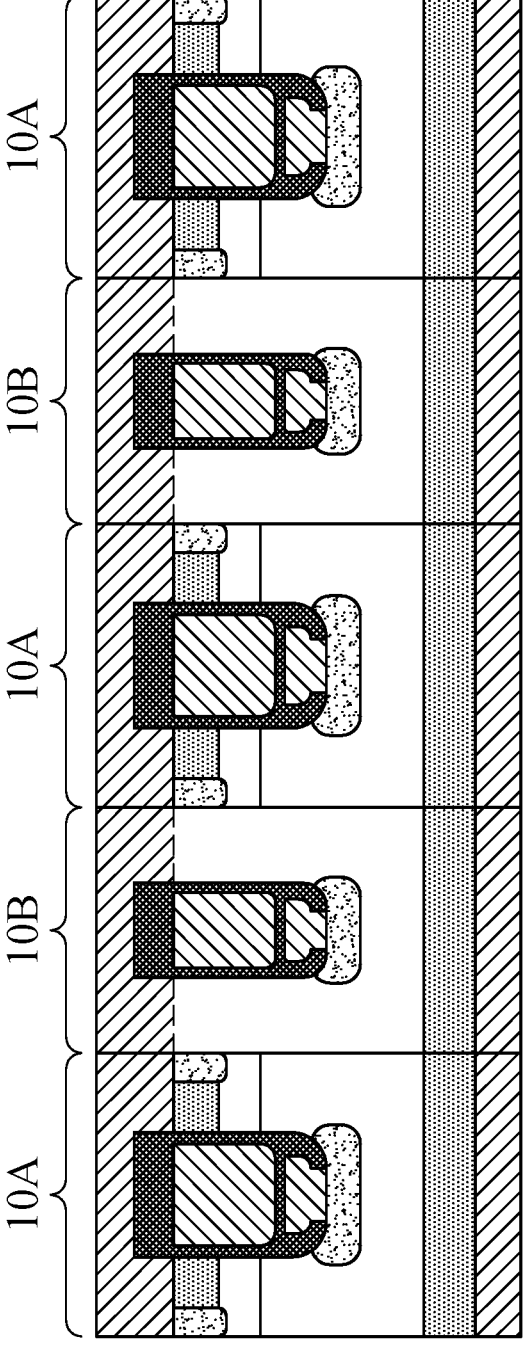
FIG. 2B illustrates a schematic cross-sectional view showing a layout of first units and second units, in accordance with some embodiments of the present disclosure.

FIG. 2B illustrates a schematic cross-sectional view showing a layout of first units 10A and second units 10B, in accordance with some embodiments of the present disclosure. In some embodiments, as shown in FIG. 2B, the first units 10A and the second units 10B are laterally arranged in an alternating manner. Since the first units 10A are portions through which current flows when the semiconductor structure 10 is turned on, the first units 10A become heat sources. By arranging a second unit 10B between two first units 10A, the two heat sources can be isolated and the temperature rise rate of the chip can be slowed down.

Figure 3A:
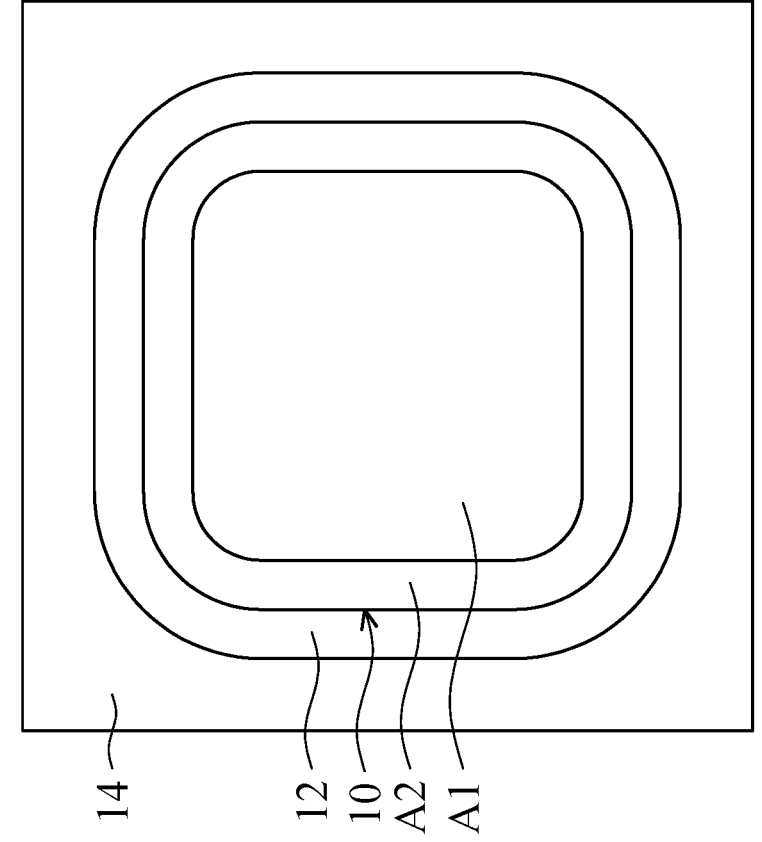
FIG. 3A illustrates a top view of a semiconductor device, in accordance with some other embodiments of the present disclosure.

FIG. 3A illustrates a top view of a semiconductor device 2, in accordance with some other embodiments of the present disclosure. The difference with the semiconductor device 1 shown in FIG. 2A is that the semiconductor structure 10 in the semiconductor device 2 has a first region A1 and a second region A2, and the first units and second units respectively serving as the control units and diode units of the semiconductor device 1 are located in the first region A1 and the second region A2, respectively. In some embodiments, the first region A1 or the second region A2 laterally surrounds the other. For example, as shown in FIG. 3A, in some embodiments, the second region A2 laterally surrounds the first region A1. In other embodiments, there may also be a configuration in which the first region A1 laterally surrounds the second region A2. The functions and materials of the transition layer 12 and the channel blocking layer 14 are similar to those of the transition layer 12 and the channel blocking layer 14 in FIG. 2A, and their descriptions are omitted here for simplicity.

Figure 3B:
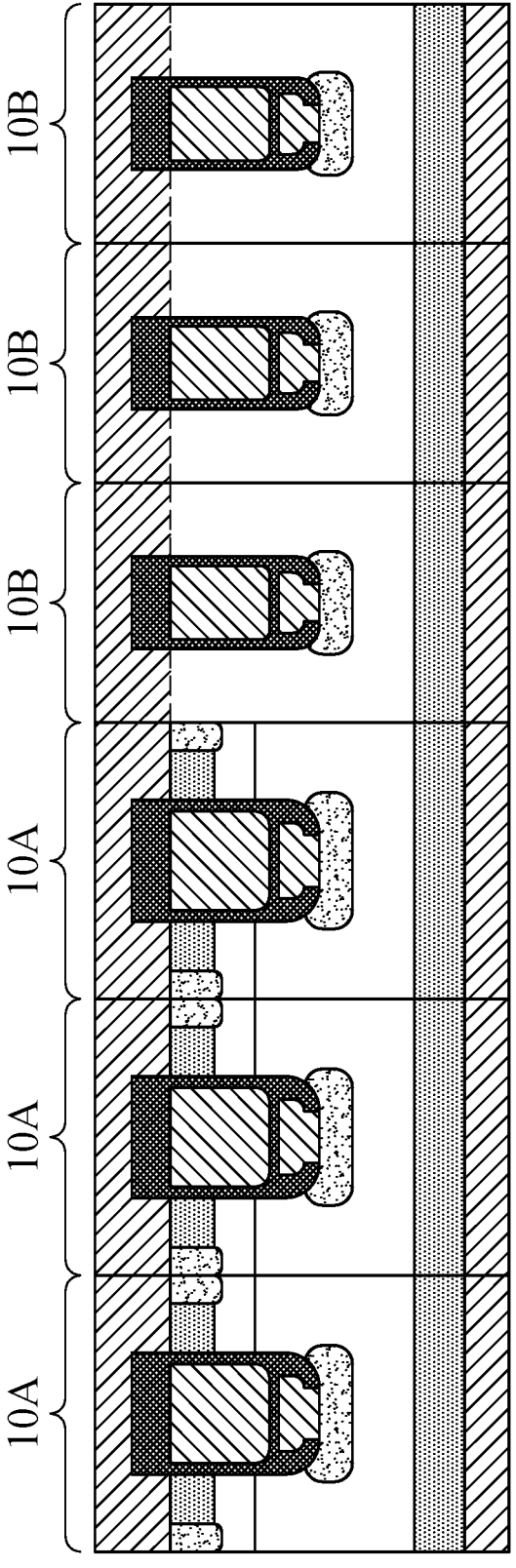
FIG. 3B illustrates a schematic cross-sectional view showing a layout of first units and second units, in accordance with some other embodiments of the present disclosure.

FIG. 3B illustrates a schematic cross-sectional view showing a layout of first units 10A and second units 10B, in accordance with some other embodiments of the present disclosure. As shown in FIG. 3B, in the embodiments where a plurality of first units 10A and a plurality of second units 10B are arranged in respective areas, the plurality of first units 10A are adjacent to each other, and the plurality of second units 10B are adjacent to each other. In this way, since the complexity of routing from the source, drain, and gate to the first units 10A and the second units 10B can be reduced, the manufacturing process of the semiconductor structure 10 can be performed more easily.

It should be noted that although the first unit 10A and the second unit 10B are shown adjacent to each other in FIGS. 2B and 3B, but the present disclosure is not limited thereto. In some other embodiments, for example, there may be additional structures disposed between the first units 10A and the second units 10B.

Figure 4:
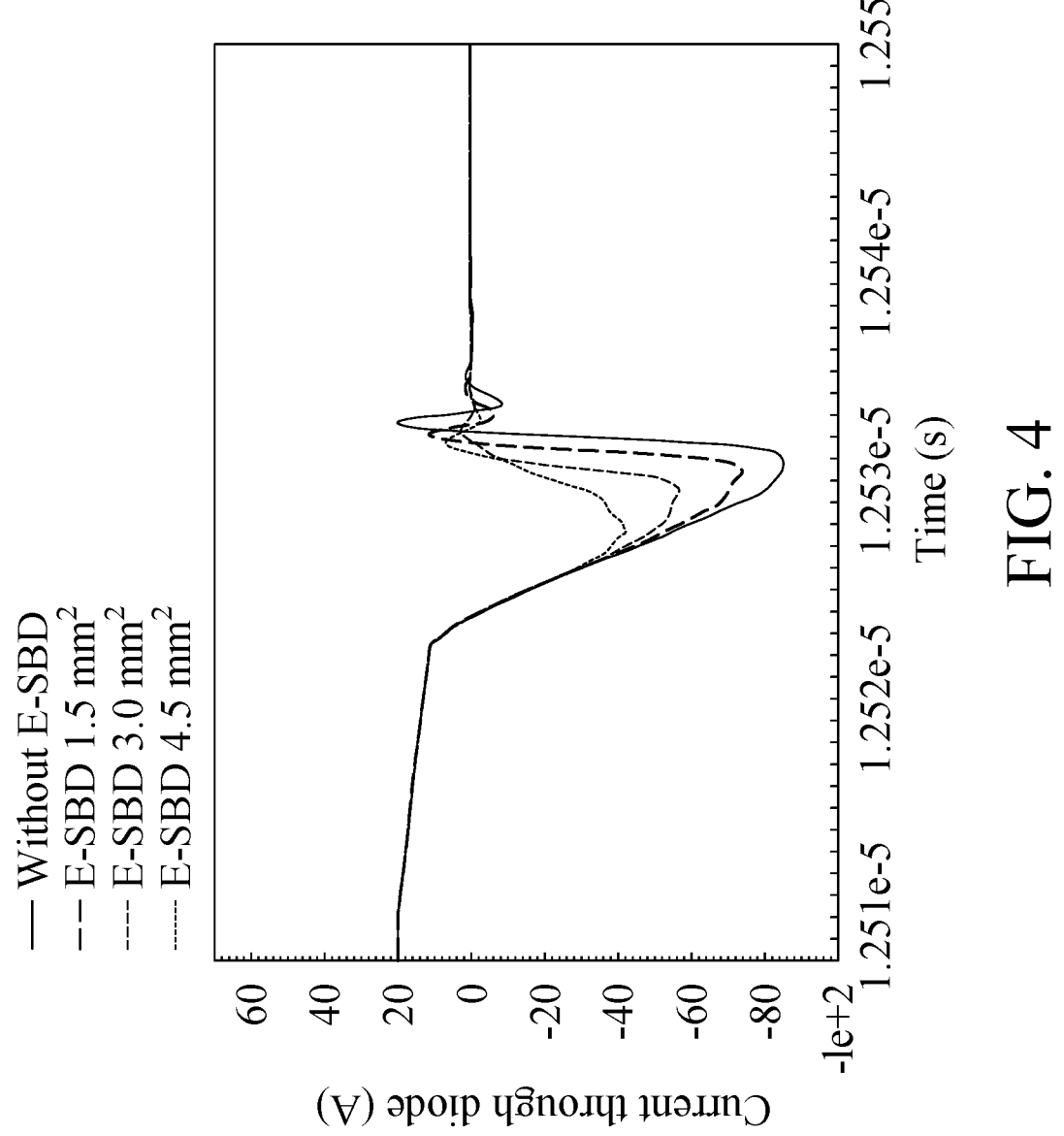
FIG. 4 illustrates the effect of the area of the region with the embedded Schottky barrier diode (E-SBD) in the semiconductor device on the current change of the semiconductor device during reverse recovery, in accordance with some other embodiments of the present disclosure.
Figure 5:
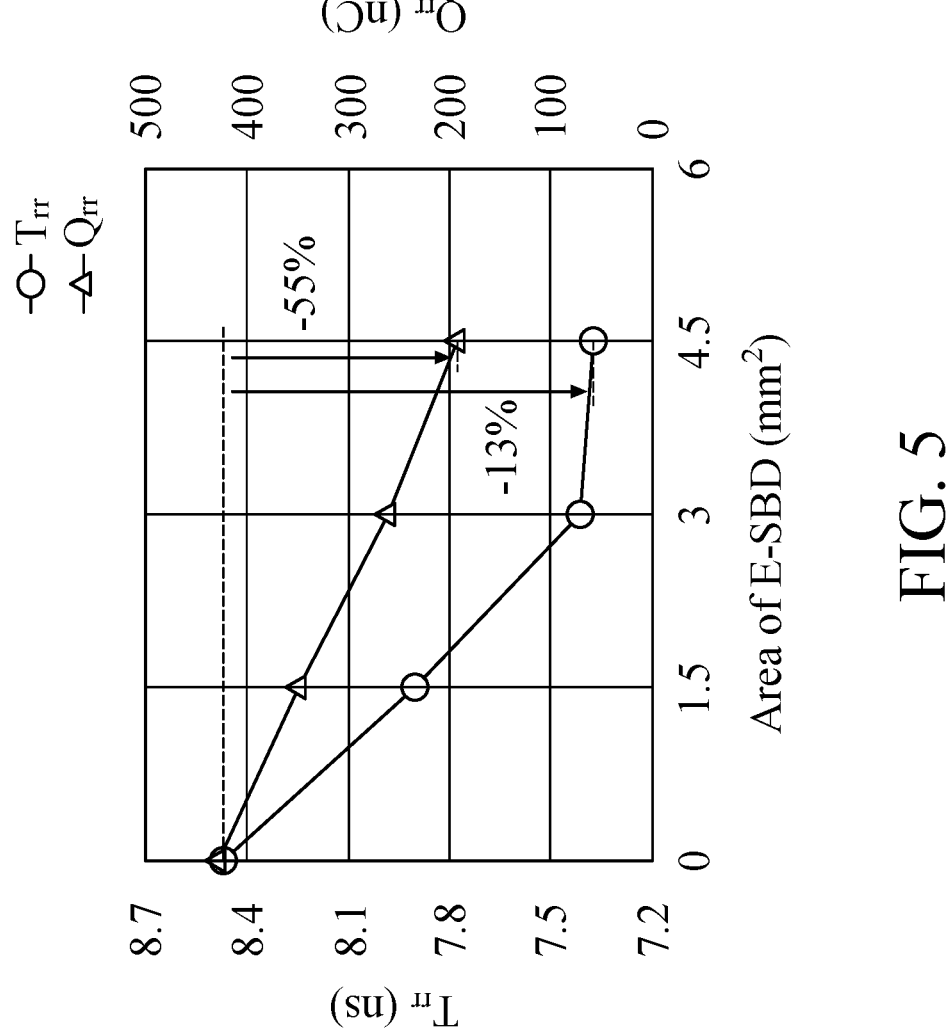
FIG. 5 illustrates the effect of the area of the region with the embedded Schottky barrier diode in the semiconductor device on the reverse recovery time ($T_{rr}$) and reverse recovery charge ($Q_{rr}$) of the semiconductor device, in accordance with some other embodiments of the present disclosure.
Figure 6:
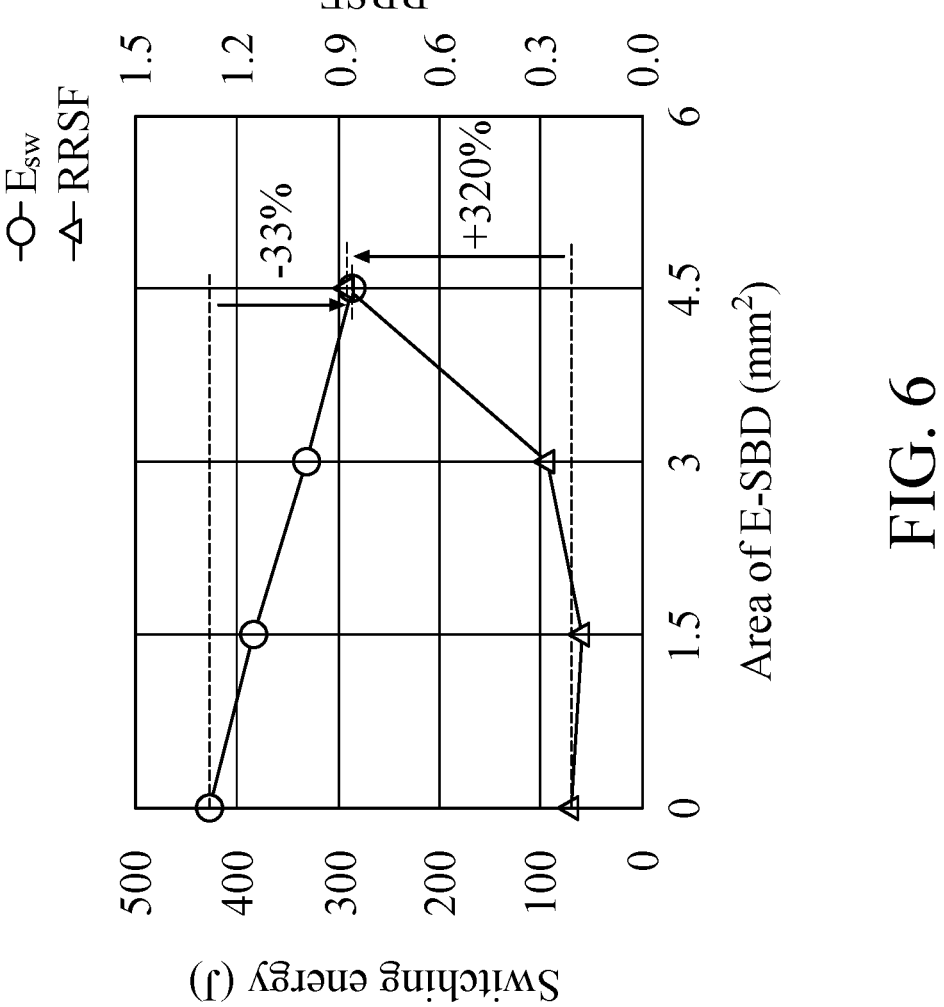
FIG. 6 illustrates the effect of the area of the region with the embedded Schottky barrier diode in the semiconductor device on the switching energy ($E_{sw}$) and reverse recovery softness factor (RRSF) of the semiconductor device, in accordance with some other embodiments of the present disclosure.
Figure 7:
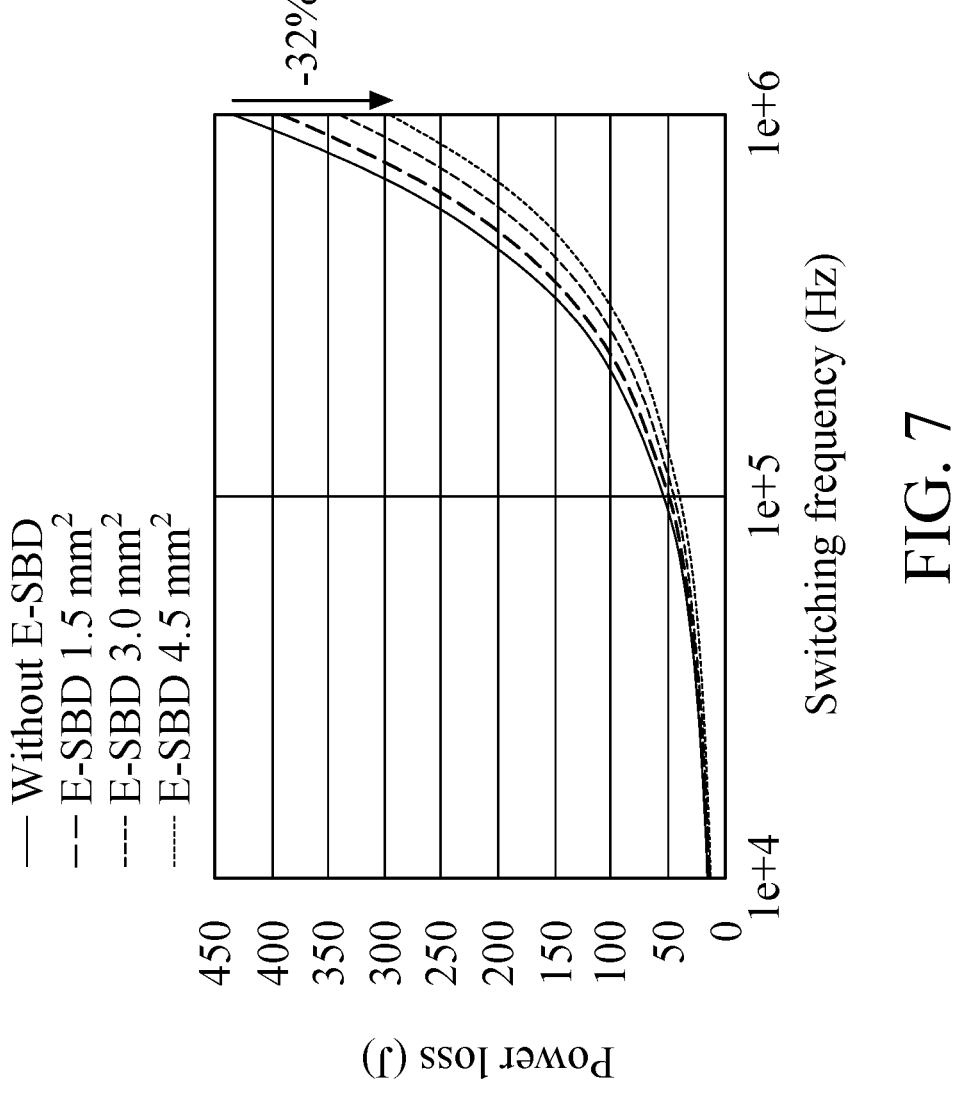
FIG. 7 illustrates the effect of the area of the region with the embedded Schottky barrier diode in the semiconductor device on the power loss of the semiconductor device under different switching frequencies, in accordance with some other embodiments of the present disclosure.

FIG. 4 illustrates the effect of the area of the region with the embedded Schottky barrier diode (E-SBD) (referred to as the diode region in the following) in the semiconductor device on the current change of the semiconductor device during reverse recovery, in accordance with some other embodiments of the present disclosure. FIG. 5 illustrates the effect of the area of the diode region in the semiconductor device on the reverse recovery time ($T_{rr}$) and reverse recovery charge ($Q_{rr}$) of the semiconductor device. FIG. 6 illustrates the effect of the area of the diode region in the semiconductor device on the switching energy ($E_{sw}$) and reverse recovery softness factor (RRSF) of the semiconductor device. FIG. 7 illustrates the effect of the area of the diode region in the semiconductor device on the power loss of the semiconductor device under different switching frequencies.

The measurement of the current change during reverse recovery shown in FIG. 4 may be performed by numerical simulation software, and people with ordinary skill in the art may choose to measure the voltage and current arbitrarily. In addition, people with ordinary skill in the art can select the area of a specific region with control elements (such as the first region A1 in FIG. 3A or the region occupied by the first units in the semiconductor structure, hereinafter referred to as the control region), thereby observing the influence of the area of the diode region on the current change of the semiconductor device during reverse recovery. In a specific example, a dynamic test is performed with a voltage of 800V and a current of 20 A, so as to obtain the change of diode current with time as shown in FIG. 4.

In the current waveform of each measurement result, the time that the diode current decreases from the beginning to the reverse peak value is called ta, and the time from the reverse peak value to the zero point of current is called tb, and the sum of the times ta and tb may be referred to as the reverse recovery time (Trr). It can be seen from FIGS. 4 and 5 that as the area of the diode region increases relative to the area of the control region, the reverse recovery time of the semiconductor device gradually decreases, that is, the semiconductor device has a faster response speed.

In addition, in each current waveform in FIG. 4, the value of integrating the current with time during the period from the beginning of the current decrease to the return to the zero point of the current is the reverse recovery charge (Qrr) during the reverse recovery period. It can be known from FIGS. 4 and 5 that, as the area of the diode region increases relative to the area of the control region, the reverse recovery charge of the semiconductor device gradually decreases. Referring to FIG. 6, as the area of the diode region increases, the switching energy (Esw) decreases gradually. Therefore, by connecting the second unit as a diode element in parallel to the first unit as a control element, the power loss during operation of the semiconductor device can be reduced.

The ratio tb/ta of time tb and ta may be called reverse recovery softness factor (RRSF). It can be seen from FIGS. 4 and 6 that as the area of the diode region increases relative to the area of the control region, the reverse recovery softness factor (RRSF) of the semiconductor device gradually increases, and the slope of the current value versus time in the process where the current value goes from the reverse peak value to the zero point becomes smaller. Therefore, by connecting more second units with diode elements in parallel to the first unit as a control element, it is possible to reduce the possibility of a semiconductor device generating a spike voltage after reverse recovery, avoiding the occurrence of additional power loss.

Next, referring to FIG. 7, as the area of the diode region increases relative to the area of the control region, the power loss of the semiconductor device at each switching frequency also decreases. This is because the power loss of the semiconductor device comes from the power loss during current conduction and switching, and since the area of the diode region increases, the switching energy decreases, which reduces the power loss during switching.

The present disclosure provides a semiconductor structure and a semiconductor device including the semiconductor structure, and the semiconductor structure may include a first unit and a second unit respectively used as a control element and a diode element. Multiple field plate structures of the present disclosure are disposed in both the first unit and the second unit, and the first unit and the second unit may be formed to have a common substrate and epitaxial layer. Therefore, the manufacturing of the control unit and the diode unit of the present disclosure can be well integrated, thereby reducing the use of masks in the manufacturing process and avoiding additional parasitic inductance between the two units. Furthermore, the second cell used as a single carrier element can reduce the reverse recovery time of the semiconductor structure. The shielding layers disposed between the bottom portions of the field plate structures and the epitaxial layer can reduce the electric field in the oxide of the field plate structures and reduce the parasitic capacitance between the gate and the drain of the semiconductor structure. Furthermore, reducing the surface electric field of the Schottky diode through the disposition of the field plate structures and the shielding layers can reduce the leakage current from the image force barrier lowering effect. Therefore, the semiconductor structure and semiconductor device of the present disclosure can reduce power loss during operation while having better reverse recovery properties.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
an epitaxial layer disposed on the substrate;
multiple field plate structures comprising a first field plate structure and a second field plate structure disposed in a first unit and a second unit of the semiconductor structure, respectively;
multiple shielding layers disposed between bottom portions of the field plate structures and the epitaxial layer;
an upper electrode layer covering the field plate structures, wherein the upper electrode layer is separated from the epitaxial layer in the first unit and in direct contact with the epitaxial layer in the second unit; and
a lower electrode layer disposed under the substrate and opposite to the epitaxial layer,
wherein each of the field plate structures comprises:
a conductive filling layer with at least a portion thereof embedded in the epitaxial layer; and
a dielectric spacer layer extending between the conductive filling layer and the epitaxial layer; and
wherein the dielectric spacer layer comprises an opening, and the conductive filling layer is in direct contact with the shielding layers through the opening.

2. The semiconductor structure as claimed in claim 1, wherein the dielectric spacer layer has a top portion extending between the conductive filling layer and the upper electrode layer.

3. The semiconductor structure as claimed in claim 1, wherein the conductive filling layer comprises an upper conductive layer and a lower conductive layer separated by the dielectric spacer layer, and the upper conductive layer in the first unit is electrically connected to a gate.

4. The semiconductor structure as claimed in claim 3, wherein the lower conductive layer is electrically connected to a source, and the upper conductive layer in the second unit is electrically connected to the gate or the source.

5. The semiconductor structure as claimed in claim 3, wherein an area of a lower surface of the lower conductive layer is smaller than an area of an upper surface of the lower conductive layer.

6. The semiconductor structure as claimed in claim 1, wherein in the second unit, there is a Schottky contact at an interface between the upper electrode layer and the epitaxial layer.

7. The semiconductor structure as claimed in claim 1, wherein the epitaxial layer comprises a doped structure laterally surrounding the first field plate structure and located at an interface with the upper electrode layer in the first unit.

8. The semiconductor structure as claimed in claim 7, wherein an upper surface of the doped structure is lower than an upper surface of the first field plate structure.

9. The semiconductor structure as claimed in claim 7, wherein an upper surface of the doped structure and an upper surface of the epitaxial layer in the second unit are coplanar.

10. The semiconductor structure as claimed in claim 1, wherein top portions of the field plate structures protrude into the upper electrode layer.

11. The semiconductor structure as claimed in claim 1, wherein the substrate and the epitaxial layer extend continuously between the first unit and the second unit.

12. The semiconductor structure as claimed in claim 1, wherein an upper surface of the epitaxial layer in the first unit is at the same height as another upper surface in the second unit.

13. The semiconductor structure as claimed in claim 1, wherein the substrate and the epitaxial layer have a first conductivity type, and the shielding layers have a second conductivity type opposite to the first conductivity type.

14. The semiconductor structure as claimed in claim 1, wherein the first unit and the second unit are electrically connected in parallel via the upper electrode layer and the lower electrode layer.

15. The semiconductor structure as claimed in claim 1, wherein the epitaxial layer comprises silicon carbide.

16. A semiconductor device, comprising:
the semiconductor structure as claimed in claim 1;
a transition layer laterally surrounding the semiconductor structure; and
a channel blocking layer laterally surrounding the transition layer,
wherein the semiconductor structure has a plurality of the first units and the second units.

17. The semiconductor device as claimed in claim 16, wherein each of the first units and the second units are laterally arranged in an alternating manner.

18. The semiconductor device as claimed in claim 16, wherein the first units and the second units are located at a first region and a second region of the semiconductor structure, respectively, and the first region or the second region laterally surrounds the other.

* * * * *